United States Patent [19]
Fischer

[11] Patent Number: 5,336,944
[45] Date of Patent: Aug. 9, 1994

[54] DETECTOR CIRCUIT FOR DETECTING STATE CHANGES OF A BINARY SIGNAL

[75] Inventor: Martin Fischer, Heilbronn, Fed. Rep. of Germany

[73] Assignee: Hewlett Packard Company, Palo Alto, Calif.

[21] Appl. No.: 964,921

[22] Filed: Oct. 22, 1992

[30] Foreign Application Priority Data

Nov. 11, 1991 [EP] European Pat. Off. ........ 91119165

[51] Int. Cl.$^5$ .................. H03K 5/153; H03K 3/284; G06G 7/14; G01R 19/14
[52] U.S. Cl. ......................... 307/350; 307/351; 307/353; 307/354; 307/362; 307/272.1; 328/146; 328/151; 324/133
[58] Field of Search ............... 307/360, 517, 351, 354, 307/362, 353, 350, 272.1; 328/146, 149, 151; 324/133

[56] References Cited

U.S. PATENT DOCUMENTS

| | | | |
|---|---|---|---|
| 4,524,291 | 6/1985 | Lehning | 307/517 |
| 4,680,542 | 7/1987 | Krupp | 324/133 |
| 4,968,902 | 11/1990 | Jackson | 307/360 |
| 5,210,527 | 5/1993 | Smith et al. | 307/360 |

FOREIGN PATENT DOCUMENTS 0325670 2/1989 European Pat. Off. .
WO88/04781 12/1987 PCT Int'l Appl. .

OTHER PUBLICATIONS

Schmid et al., "Der Wellenreitende Amplitudfensterdiskriminator", Biomedicinische Technik, vol. 30, No. ½, Feb. 1985, Berlin Germany, pp. 7-11.

Primary Examiner—Timothy P. Callahan
Assistant Examiner—Trong Phan

[57] ABSTRACT

A detector circuit, preferably for an integrated circuit tester, compares an unknown binary signal with two reference voltages. The outputs of comparators are fed to a 1-of-n decoder whose outputs are, in turn, fed to latch circuits. Those latch circuits comprise a feedback loop which is activated by a control signal such that they may be operated either in a transmission mode or in a mode wherein all states of the unknown binary signal A during a prescribed time window may be recorded. The outputs of latch circuits are fed to D flip-flops, in order to sample the outputs of the latch circuits.

10 Claims, 4 Drawing Sheets

DETECTOR CIRCUIT FOR DETECTING STATE CHANGES OF A BINARY SIGNAL

FIELD OF THE INVENTION

The present invention relates to a detector circuit for detecting state changes of an unknown binary signal, preferably for an integrated circuit tester.

BACKGROUND OF THE INVENTION

In general, integrated circuit testers excite one or more pins of a device under test (DUT), and then wait for the response of the DUT. In order to qualify the response, a response unit detects the state of the DUT's output signal at certain points in time, and/or triggers on state changes occurring during a prescribed time window.

The latter function, i.e. the detection of state changes of an unknown binary signal during predefined time intervals, is already addressed in DE-C-33 46 942. The circuit described in this document uses two D flip-flops for the comparison.

Another, more sophisticated approach is disclosed in EP-B-325 670. Two edge triggered D flip-flops are alternatingly activated by two pulse sequences. The D input of either flip-flop is connected with the output of respective a OR gate, wherein the $\overline{Q}$ outputs of the flip-flops are fed back to one input of the respective OR gate. The feedback loops thus lock the respective flip-flop as soon as a transition of the unknown binary signal occurs during a prescribed time window.

Both prior art approaches use D flip-flops as major components of the detector circuit. However, the use of D flip-flops implies considerable recovery times in the circuit. The required recovery times, in turn, limit the applicability of the detector circuit in two respects:

1. An interfering or disturbing pulse of short pulse width cannot be detected. This is because the recovery time of the flip-flop is longer than the duration of the disturbing pulse, such that the feedback loop cannot cause the flip-flop to lock. The prior art design thus limits the detectable pulse width of disturbing pulses.
2. The required recovery time forces a modest repetition rate of the predefined control windows, which, in turn, leads to moderate test frequencies and long test cycles.

The above effects restrict the applicability of the prior art circuits for integrated circuits with complex functionality like new microprocessors, RISC (reduced instruction set) CPU's and their peripheral IC's.

SUMMARY OF THE INVENTION

It is therefore a major object of the present invention to provide a detector circuit of the kind described above which avoids the disadvantages resulting from the required recovery time of the flip-flops. According to the present invention, this object is solved by a detector circuit with the following characteristics:

1. at least one comparator circuit receiving the unknown binary signal,
2. a 1-of-n decoder coupled to the output of the comparator circuit, and
3. at least one latch circuit connected with at least one output of said 1-of-n decoder, wherein the latch circuit comprises a feedback loop which may be activated by a control signal.

The unknown binary signal of a device under test (DUT) is thus fed to a comparator which compares the signal with a predefined reference voltage. The output of the comparator may e.g. be 0 Volts if the unknown binary signal is below the reference voltage, and 5 Volts in case the unknown binary signal exceeds the reference voltage. The output signal of the comparator is then fed to a 1-of-n decoder. The 1-of-n decoder interprets the comparator output signal as a binary code. Every possible (or allowed) combination of input levels activates one-and only one-of the outputs of the 1-of-n decoder. 1-of-n decoders of this kind as such are well-known in the art, see for example the SN 7442 1-of-10 decoder in TTL Technology. Decoders specifically adapted to the present invention will be discussed in the detailed description. In the simplest case wherein only one comparator circuit is provided, the 1-of-n decoder will be a 1-of-2 decoder.

Thus, every output of the 1-of-n decoder corresponds to a certain state of the unknown binary signal. In the simplest case of a 1-of-2 decoder, one output of the decoder indicates a "0" level of the unknown binary signal, and the other output indicates a "1" level.

At least one output of the decoder is fed to a latch circuit comprising a feedback loop which may be activated by a control signal. The control signal defines a time window during which the occurring levels of the unknown binary signal are to be recorded.

It will be evident from the above explanations that every output signal of the 1-of-n decoder corresponds to a certain level of the unknown binary signal. When the control signal activates the feedback loop, the corresponding level of the unknown binary signal is stored. As long as the control signal activates the feedback loop, every output of a latch circuit thus indicates whether the unknown binary signal has been in a certain logic state during appliance of the control signal.

It is understood that it is of advantage to connect every output of the 1-of-n decoder with a latch circuit of the kind described above. Every state of the unknown binary signal during the appliance of the control signal, i.e. during a time window, can thus be detected. However, in case only a certain logic level is of interest, a single latch circuit may also be sufficient.

As outlined above, only one comparator is required in order to distinguish the "0" and the "1" state of the unknown binary signal. However, in a preferred embodiment of the invention, two comparators are provided. The comparators receive different reference voltages, such that it is possible to distinguish between a "0", an intermediate and a "1" state. This is particularly useful if 2-level logic is used; the bands for the "0" and the "1" levels will then be very small, and the intermediate level will be quite broad. However, the basic underlying scheme may also be expanded to a multiplicity of comparators, e.g. in the case of a multi-level logic.

The detector circuit according to the present invention needs no flip-flops to store the states of the unknown binary signal. Thus, the recovery time problem is eliminated. Therefore, the device under test may be tested with a considerably higher frequency than provided by prior art circuits. Further, even very short disturbing pulses may be recorded.

Preferably, the feedback loop locks the latch circuit if the output signal of the 1-of-n decoder is at or enters a certain logic state, preferably logic "1", during a time window defined by the control signal. It is understood that, dependent on the polarity of the control signal and the circuitry used, the detector circuit may not only trigger on the logic state "1", but also on a logic "0", or other states of the unknown binary signal.

The detector circuit as described above may be used to record all logic states of the unknown binary signal during a prescribed time window. However, it has already been mentioned that the response unit of an integrated circuit tester should also be able to record the logic state at arbitrary points in time. In prior art detector circuits, a second circuit (e.g. an edge-triggered flip-flop) has been used for this purpose. This flip-flop did not comprise a feedback loop.

Therefore, prior art response units required two detector circuits, one for the detection of state changes during prescribed time windows, and the second for testing the logic state at any point in time. This increased the cost and complexity of the detector. Further, the two detector circuits had to be calibrated separately.

In an advantageous embodiment of the present invention, these disadvantages are overcome. According to this embodiment, the latch circuit transmits the output signal of the 1-of-n decoder if the feedback loop is deactivated by the control signal. That is, the detector circuit has a double function: As long as the control signal is in its "inactive" state (e.g., "0"), the detector circuit operates like a transfer gate, i.e. is "transparent" to the logic state indicated by the 1-of-n decoder. In this mode of operation, the inventive detector circuit may be used to test the logic state of the unknown binary signal at an arbitrary point in time. On the other hand, if the control signal enters its active state, it defines a time window, and at the end of the time window the outputs of the latch circuits indicate all logic states of the unknown binary signal during the window. This is the second function of the inventive detector circuit.

The new circuit thus combines both functionalities, thus eliminating the need for a second calibration and the costs for a second circuitry. The recovery time problem which applied to both of the prior art detector circuits discussed above are omitted.

In a preferred embodiment of the invention, the latch circuit basically consists of
  a first gate,
    a first input of the first gate being connected with the output of the 1-of-n decoder, and
  a second gate,
    a first input of the second gate receiving the control signal,
    a second input of the second gate being connected with an output of the first gate, and
    an output of the second gate being connected with a second input of the first gate.

The recovery time of such a latch is in the magnitude of a propagation delay of a single gate, which is considerably lower than the recovery time of a flip-flop. In fact, the output signal of the 1-of-n decoder has to pass a single gate only. In case the control signal is "active" and a transition of the unknown binary signal from "0" to "1" occurs, or in case the unknown binary signal has already been "1" when the control signal entered its "active" state, the feedback loop is activated which locks the two gates. At the end of the time window defined by the end of the active state of the control signal, the latches indicate all logic states of the unknown binary signal during the time window.

If, on the other hand, the control signal is in its "inactive" state, the feedback loop and the second gate are also inactive, such that the latch circuit "transmits" the output of the 1-of-n decoder.

Preferably, the first gate is an OR-gate and the second gate is an AND-gate. As long as the control signal is "0", the output of the AND-gate will also be "0", and the output of the OR-gate will follow the output of the 1-of-n decoder. In case the control signal becomes "1", and the output of the 1-of-n decoder is or becomes "1", the AND-gate will generate a "1" at its output, such that the output signal of the latch circuit becomes permanently "1". As long as the control signal is active, both inputs of the AND-gate will then be "1".

Although the above explanations have been made for an environment suited to detect a transition of the 1-of-n decoder's output from "0" to "1", it is understood that a similar design may be used to detect state changes from "1" to "0". Further, the polarity of the control signal, or of the outputs of the 1-of-n decoder, may be reversed. Other gates than the above mentioned OR-/AND-combinations may also be used; one of these combinations will be discussed in the detailed description.

In a preferred embodiment of the present invention, the output of the latch circuit is connected with a sample circuit, preferably a sample-and-hold circuit. In this configuration, it is possible to sample the output of the latch at any point in time for further processing; e.g., sampling may occur at the end of a "time window" (i.e. just prior to the control signal returning from its active state to its inactive state), such that the output of the sample circuit produces a stable signal indicating whether the DUT has been in the corresponding state during the time window. It is understood that, in case multiple latch circuits are used, sample circuits connected to the output of every latch circuit are preferred, such that all states of the unknown binary signal during the time window can be tested.

In a preferred embodiment, the sample circuit is a flip-flop, in particular a D flip-flop. In case a multiplicity of D flip-flops are used, they may be clocked (triggered) by a common pulse.

The invention also relates to a method for detecting state changes of an unknown binary signal, preferably in an integrated circuit tester, said method being characterized by the steps of
  1. feeding the unknown binary signal to one input of at least one comparator circuit,
  2. feeding an output signal of the comparator circuit to an input of a 1-of-n decoder, and
  3. feeding the output signal of the 1-of-n decoder to a latch circuit comprising a feedback loop which may be activated by a control signal.

In a preferred embodiment, said method is further characterized by the additional step of feeding an output signal of the latch circuit to an input of a sample circuit, preferably a sample-and-hold circuit such as a D flip-flop.

Advantageously, the logic circuitry used in the present invention may use differential inputs and outputs, in order to increase operating speed and to balance the circuits.

Further features and advantages of the invention will be disclosed in the following detailed description.

DESCRIPTION OF THE DRAWINGS

The invention will now be described, by means of a non-limiting example, with reference to the accompanying drawings, in which:

FIGS. 2(a)–(o) is a timing diagram of the circuit in FIG. 1.

DETAILED DESCRIPTION OF THE INVENTION

Figure 1:
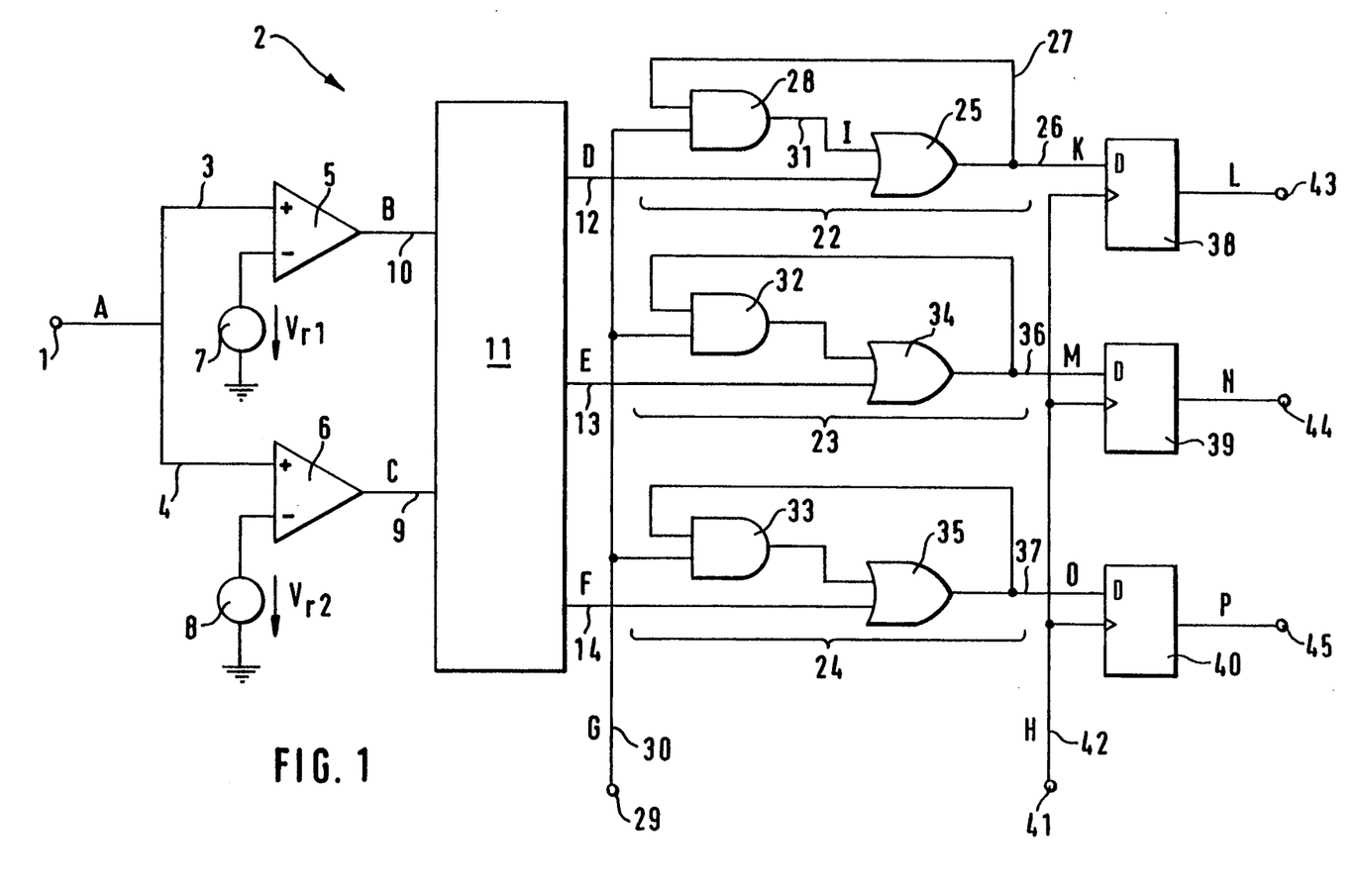
FIG. 1 depicts a first embodiment of a detector circuit according to the present invention.

In the embodiment of FIG. 1, the unknown binary signal is fed to an input 1 of a detector circuit generally labelled as 2. That is, input 1 is in electrical contact with a pin of a device under test (DUT) in an integrated circuit tester.

The signal received at input 1 is fed (via lines 3 and 4) to the non-inverting inputs of two comparators 5 and 6. The inverting inputs of the comparators are connected with respective reference voltage sources 7 and 8. The two reference voltages are different and thus establish two different limits. In the shown example, reference voltage $V_{r2}$ is smaller than reference voltage $V_{r1}$, i.e. $V_{r2} < V_{r1}$. For example, if a 5 V-logic is used, $V_{r2}$ may be equal to 0.4 V and $V_{r1}$ may be equal to 2.4 V.

If the unknown binary signal received at input 1 is therefore below $V_{r2}$, both comparators 5 and 6 will produce a "0" (or a negative) voltage. In case the voltage of the unknown binary signal exceeds $V_{r2}$, but is below $V_{r1}$, the voltage at output 9 of comparator 6 will be approximately the supply voltage, and the voltage at output line 10 of comparator 5 will be 0 V. In case the voltage of the unknown binary signal exceeds $V_{r2}$ as well as $V_{r1}$, both output signals of comparators 5 and 6 will be approximately the (positive) supply voltage. For easier reference, the unknown binary signal at input 1 will be designated as "A", whereas the output signals of comparators 5 and 6 will be referred to as "B" and "C".

Signals B and C are fed to the inputs of a 1-of-3 decoder 11. Operation of such a decoder is, in general, known in the art. It decodes any allowed combination of input signals B and C into a certain output signal, i.e. one of the outputs is always "true" (if positive logic is used, this corresponds to "high"), and the others are "false". In the shown example, 1-of-3 decoder 11 operates according to the following truth table:

| B | C | D | E | F |
|---|---|---|---|---|
| 0 | 0 | 0 | 0 | 1 |
| 0 | 1 | 0 | 1 | 0 |
| 1 | 1 | 1 | 0 | 0 |

In the above table, the output signals of decoder 11 on output lines 12, 13 and 14 have been labelled as D, E and F. It will be noted that the signal F on output line 14 corresponds to a "low" state of the unknown binary signal A, i.e. signal F is "high" (in case positive logic is used) if the voltage of the unknown binary signal A is below $V_{r2}$ and $V_{r1}$. Likewise, output signal E decodes the "intermediate" state of signal A, i.e. $V_{r2} < A < V_{r1}$. Output signal D indicates the "high" state of signal A, i.e. $A > V_{r1} > V_{r2}$. Thus, always one of the output signals of 1-of-3 decoder 11 is logic "1" indicating the current state of the unknown binary signal A, whereas the other outputs are 0.

It will be noted that the state B=1, C=0 is not decoded by 1-of-3 decoder 11, as this condition cannot occur.

1-of-3 decoder 11 may be implemented in any suitable technology and with any logic performing the function of the above truth table. One example of a decoding circuit is given in FIG. 3. Signal B received at input 15 is directly fed to output 16 which corresponds to the D output. That is, if B=1, then D=1, as indicated in the bottom line of the above truth table. It will be noted that, in this case, E=F=0.

Figure 3:
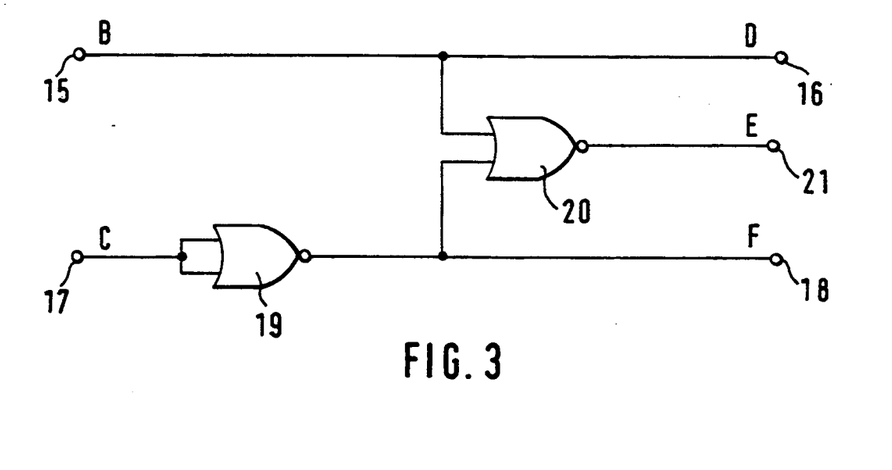
FIG. 3 shows a decoder which may be used in the environment of FIG. 1.

If the decoding circuit of FIG. 3 receives "0" signals on inputs 15 and 17 (B=C=0), then the output signal F (output 18) is 1, as NOR-gate 19 operates as an inverter. On the other hand, if B=0 and C=1, NOR-gate 20 receives two "0" signals at its inputs, such that E=1 on line 21. These are the functions defined in the first and second line of the above truth table.

It will be understood that the environment of FIG. 3 is only an illustrative embodiment of a 1-of-3 decoder and that other decoders implementing the above truth table may be used as well. For example, it may be desirable to use a more complex design which buffers the signal between input 15 and out-put 16, or the like.

Returning to FIG. 1, the output signals D, E and F of 1-of-3 decoder 11 are fed to corresponding latch circuits 22, 23 and 24. If we regard latch circuit 22, signal D (line 12) is fed to one input of an OR-gate 25. The output of this OR-gate is labelled K (line 26) and fed back to a first input (line 27) of an AND-gate 28. The second input of this AND-gate receives (via input 29 and line 30) a control signal G. The output of AND-gate 28 (line 31, signal I) is fed to the second input of OR-gate 25.

As long as the control signal is "0", i.e. G=0, the output of AND-gate 28 (signal I) is also 0. Therefore, the output of OR-gate 25 (signal K) follows the level of signal D. This is the "transparent" or "transmission" mode of operation of latch 22.

The second mode of operation—detection of states or state changes in a prescribed time window—is entered if the control signal activates latch 22, i.e. G=1. Control signal G also defines the "time window", i.e. the time window is defined by the length of the control pulse G (this definition of the "time window" does not take account of the sample and hold circuits, namely D flip-flops 38 to 40 which will be discussed below, i.e. the "external" time window is different from the terminology used here).

Let us assume that D=0 when the control signal enters its active state, i.e. G=1. As the second input (line 27) of AND-gate 28 still receives a "0", signal I on line 31 is also "0", and therefore the output signal K of latch circuit 22 does not change its state. However, as soon as signal D becomes "1", the output signal K will also be "1", and AND-gate 28 will likewise produce a "1" signal as both of its inputs are "1". That is, I=1. It can be easily seen that latch circuit 22 is "locked" now, i.e. will hold its output state K=1 as long as the control signal G is "1". This is because I=1, such that OR-gate 25 always produces an output signal K=1 as long as G=1.

Therefore, the state K=1 is kept, even if signal D returns to "0". In other words, even transient levels or pulses occurring during the time window are recorded by latch circuit 22. Even very short disturbing pulses may be recorded if their duration is at least longer than the propagation delay time of AND-gate 28 (which is required to "lock" latch circuit 22). However, this propagation delay time is considerably shorter than the recovery time of prior art flip-flops, such that even transients of very short duration are reliably recorded by the detector circuit according to the present invention.

Another case of interest is that signal D is already "1" when the control signal G enters its "1" state. In this case, AND-gate 28 already receives two "1" input signals at the beginning of the time window, such that the latch circuit is locked even at the very beginning of the window.

Thus, output signal K indicates reliably whether signal D has ever been "1" during the time window, i.e. whether the unknown binary signal A has ever been in the "0" state.

As soon as the control signal G returns to its "0" state, latch circuit 22 operates again in "transparent" mode.

The other latch circuits 23 and 24, constituted of AND-gates 32 and 33 and OP-gates 34 and 35, operate in similar manner as latch circuit 22. That is, output signal M of latch 23 (line 36) follows signal E as long as G=0, and stores any possible condition wherein E=1 during the time window defined by control signal G. Signal M corresponds to the "intermediate" state of the unknown binary signal A. Likewise, output signal O (line 37) of latch 24 reflects the "low" state of signal A.

Signals K, M and O are fed to the D inputs of respective D flip-flops 38, 39 and 40. The flip-flops are edge-triggered, i.e. store the state of the D input when the clock signal H (input 41, line 42) shows a positive transition from "0" to "1". Therefore, output signals L, N and P of D flip-flops 38, 39 and 40 (outputs 43, 44 and 45) reflect the status of input signals K, M and O at the time of the last positive transition of clock signal H.

D flip-flops 38, 39 and 40 (which are used as sample-and-hold circuits in the shown embodiment) may therefore store the status of the unknown binary signal A at any point in time if latch circuits 22, 23 and 24 are operated in "transparent" mode, i.e. G=0. Because the output signal of the flip-flops is stable, further processing is easy. This is the first mode of operation of the inventive detector circuit. On the other hand, if the states of the unknown binary signal A during a prescribed time window are to be tested, a positive transition of clock signal H is applied just prior to the end of the time window. If, for example, the outputs of the flip-flops are L=1, N=1 and P=0, this means that the unknown binary signal A had been in states "high" and "intermediate" during the time window. This is the second mode of operation (it will be understood that, in the first mode of operation with "transparent" latch circuits, only one of signals L, N and P will be in the "1" state, whereas the others will be "0").

Figure 4:
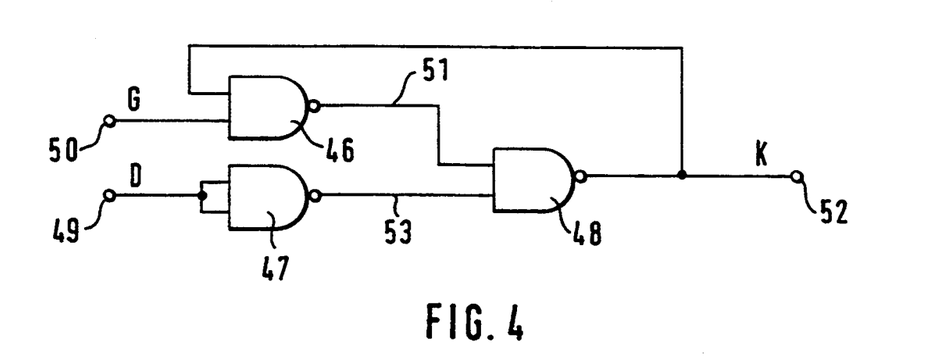
FIG. 4 depicts an alternate embodiment for the latch circuit.

It will be understood that the detector circuit shown in FIG. 1 may be modified as long as its basic functionality is kept. For example, FIG. 4 depicts an alternate embodiment of latch circuit 22. This embodiment is designed for a technology which allows easy implementation of NAND-gates and thus uses NAND-gates 46, 47 and 48. NAND-gate 47 receives signal D on line 49 and operates as an inverter. The control signal G is fed to input 50, i.e. the first input of NAND-gate 46. As long as the control signal is G=0, the output of NAND-gate 46 (line 51) is "1", such that the output of NAND-gate 48 (signal K, output 52) is the inverse of the signal on line 53. On the other hand, the signal on line 53 is the inverse of signal D, such that K=D. This is the "transparent" mode of operation of the latch.

If, on the other hand, the control signal enters its active state, i.e. G=1, the signal on line 51 is the inverse of output signal K. If D is or becomes 1, the signal on line 53 is "0", such that K=1. This state is held as long as G=1, even if D returns to "0". Therefore, G=1 causes the latch circuit of FIG. 4 to operate in the second mode of operation wherein states or state changes of the unknown binary signal are recorded. As soon as G returns to "0", the latch enters its "transparent" mode of operation again.

It will be appreciated that other configurations of a decoding circuit or of a latch may fulfill the same function; for example, an inverse logic ("0"=true, "1"=false) may be used.

Figure 2:
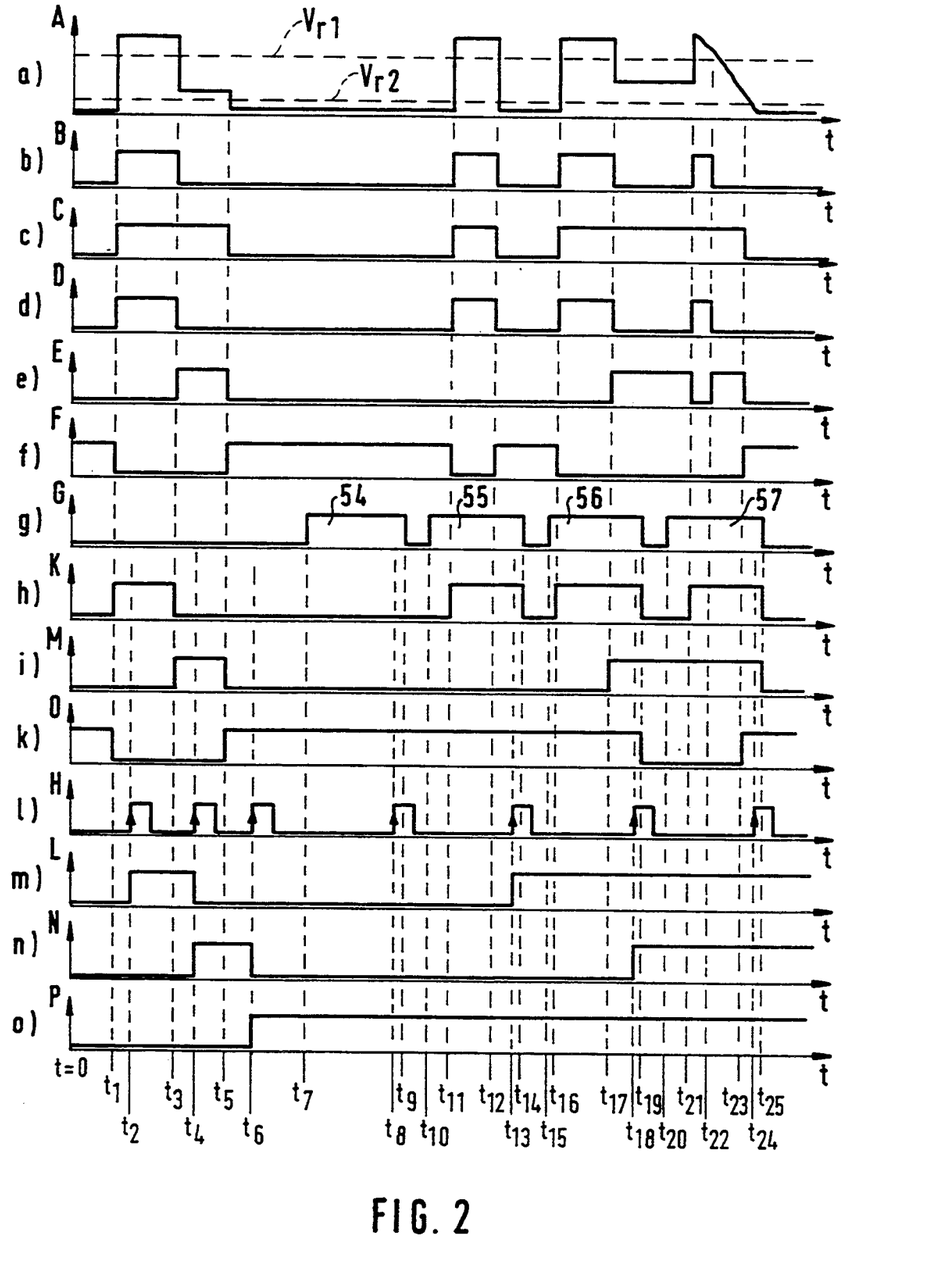

Operation of the detector circuit of FIG. 1 will now be explained in detail with reference to the timing diagram of FIG. 2. FIG. 2a depicts the levels of the unknown binary signal A over time; in this diagram, the reference voltages $V_{r2}$ and $V_{r1}$ are depicted as well. FIGS. 2b and 2c show the timing diagram of the output signals B and C of comparators 5 and 6. FIGS. 2d, 2e and 2f show the traces of output signals D, E and F of 1-of-3 decoder 11. FIG. 2g illustrates the time trace of control signal G. FIGS. 2h, 2i and 2k are the timing diagrams of output signals K, M and O of latch circuits 22, 23 and 24. FIG. 2l is the time trace of clock signal H, and FIGS. 2m, 2n and 2o depict the timing of output signals L, N and P.

In a first mode of operation from t=0 to t=$t_7$, the detector circuit is operated in its "transparent" or "transmission" mode of operation, i.e. the control signal is G=0. Between t=0 and t=$t_1$, the unknown binary signal A is below the lower reference voltage $V_{r2}$, such that both comparators produce an output of 0 V (FIGS. 2b and 2c). Decoder 11 thus activates its F output (F=1), whereas the other outputs are "0".

Between t=$t_1$ and t=$t_3$, the unknown binary signal A exceeds both reference voltages, such that both the B and C outputs are "1". This state is decoded into D=1, E=0 and F=0 by decoder 11.

Between t=$t_3$ and t=$t_5$, the unknown binary signal A is in the intermediate range, i.e. $V_{r2}$ is exceeded, whereas $V_{r1}$ is not. Therefore, B=0 and C=1. The intermediate state is decoded into D=0, E=1 and F=0 by 1-of-3 decoder 11.

After t=$t_5$, the unknown binary signal A returns to its "low" state. It will be noted that the signal is not exactly 0 V, but still in the lower range. Signals D to F thus return to their initial state.

It will be noted that, at any given point in time, only one of signals D, E and F is in the "1" state, whereas the others are at "0". This is due to the function of a 1-of-n decoder which always activates one, and only one, of its outputs.

As already mentioned, the detector circuit operates in its "transparent" mode of operation between t=0 and t=$t_7$. Therefore, signals K, M and O (FIGS. 2h to 2k) follow the level of signals D, E and F (slight time shifts caused by gate propagation have not been drawn in FIG. 2).

Signals K, M and O may be sampled at any suitable point in time, in order to detect the output of the device under test at that point in time and to establish a stable indication of such state. In the shown example, clock signal H depicts active positive transitions (from "0" to "1") at t=t$_2$, t=t$_4$ and t=t$_6$. At these points in time, the state of signals K, M and O is stored in flip-flops 38–40. For example, at t=t$_2$, the state L=1, N=0 and P=0 is sampled thus indicating that the unknown binary signal had been in the "high" state at t=t$_2$. In similar manner, the intermediate state of a signal A is stored at t=t$_4$, and its "0" level is stored at t=t$_6$.

The second mode of operation of the inventive detector circuit is shown by the control signal pulses 54–57. Each of these pulses define a time window.

During the first time window 54 (between t=t$_7$ and t=t$_8$), the unknown binary signal A keeps its "0" state. Therefore, the positive transition of clock signal H at t=t$_8$ produces an L=0, N=0 and P=1 output which indicates that the unknown binary signal A was in the "0" state throughout the time window 54.

During the second time window 55 (between t=t$_{10}$ and t=t$_{14}$), the unknown binary signal A shows a transition into its "1" state at t=t$_{11}$. This causes signal K to enter its "1" state. One will note that signal O (indicating a "0" state of the unknown binary signal) keeps its "1" state, i.e. does not return to the "0" state at t=t$_{11}$. This is because latch circuit 24 is locked as long as G=1. In similar manner, signal K does not return to its "0" state at t=t$_{12}$ when the unknown binary signal A returns to "0", which, in turn, is caused by the locking mechanism of latch 22.

At t=t$_{13}$, signals K, M and O are sampled (positive transition of clock signal H). Sampling is done just prior to the end of time window 55. The flip-flops now store the state L=1, N=0 and P=1 thus indicating that the unknown binary signal A had been in the "0" and "1" state during time window 55.

During time window 56 (between t=t$_{15}$ and t=t$_{19}$), two transitions of binary signal A occur, namely from "0" to "1" at t=t$_{16}$ and from "1" to "intermediate" at t=t$_{17}$. This causes signals K and M to enter their "1" state at t=t$_{16}$ and t=t$_{17}$, respectively (signal O keeps its "1" state). The sampling at t=t$_{18}$ thus reveals L=1, N=1 and P=1 thus indicating that the unknown binary signal A had been in all three states during time window 56.

A different time trace of the unknown binary signal A is shown during the fourth time window 57 (between t=t$_{20}$ and t=t$_{25}$). That is, at t=t$_{21}$, signal A shows a transition from its intermediate state to "1", and between t=t$_{21}$ and t=t$_{23}$ signal A slopes down. Its time trace crosses the upper reference voltage V$_{r1}$ at t=t$_{22}$, and the lower voltage reference level V$_{r2}$ at t=t$_{23}$. It is evident that the unknown binary signal A was in all three states during time window 57. This is reflected by the sampling occurring at t=t$_{24}$ which reveals L=1, N=1 and P=1.

Figure 5:
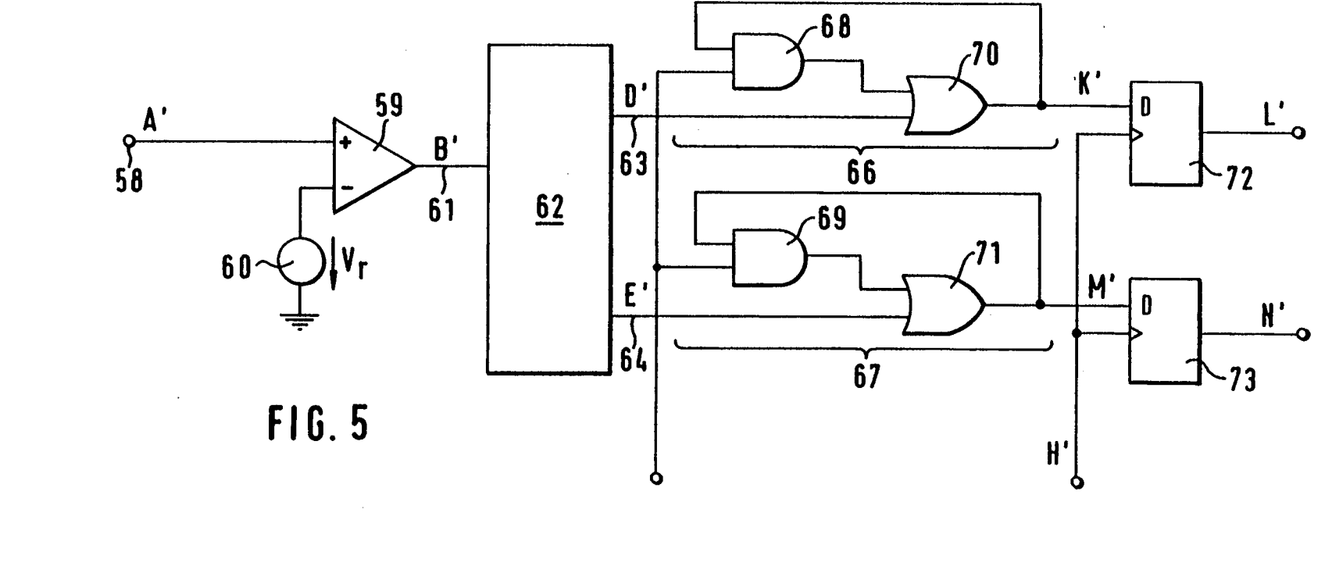
FIG. 5 depicts a second, simplified embodiment of a detector circuit according to the present invention.

A simplified embodiment of a detector circuit according to the present invention is shown in FIG. 5. This detector circuit is only able to record two levels (e.g., "0" and "1") of signal A'.

The unknown binary signal A' is fed to an input 58 and, therefore, to the noninverting input of a comparator 59 which compares the level of A' with a reference voltage V$_r$ (reference number 60). It will be noted that, as only two different states have to be distinguished in this embodiment, only one comparator is required. The output of the comparator (signal B', line 61) is fed to the input of a 1-of-2 decoder 62, which decodes input signal B' into two output signals D' (line 63) and E' (line 64). Signal D' is "1" if the unknown binary signal A' exceeds reference voltage V$_r$, and signal E' is "1" if the unknown binary signal A' is below the reference voltage. That is, the truth table of 1-of-2 decoders 62 is as follows:

| B' | D' | E' |
|----|----|----|
| 0  | 0  | 1  |
| 1  | 1  | 0  |

Figure 6:
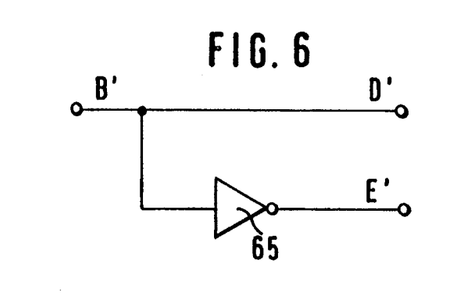
FIG. 6 shows a decoder circuit for the detector in FIG. 5.

Operation of 1-of-2 decoder 62 may therefore be implemented by the Boolean equations D'=B' and E'=B'. FIG. 6 depicts the easiest implementation of such a decoder which only requires an inverter 65.

Latches 66 and 67 (FIG. 5) are identical to latches 22, 23 and 24 of FIG. 1. They are constituted of AND gates 68 and 69 and OR gates 70 and 71. Likewise, D flip-flops 72 and 73 correspond to the D flip-flops in the environment of FIG. 1. Signals G', K', M', H', L' and N' also correspond to signals G, K, M, H, L and N of FIG. 1.

I claim:

1. A detector circuit for detecting state changes of a level of a binary signal comprising:
    comparator circuit means for receiving said level of said binary signal and for providing an output indicative of a comparison of said level of said binary signal with a reference;
    a 1-of-n decoder coupled where n is an integer to said output of said comparator circuit means; and
    latch circuit means connected with at least one output of said 1-of-n decoder, said latch circuit means including a feedback loop activatable by a control signal.

2. A detector circuit according to claim 1, wherein said feedback loop locks said latch circuit means if an output signal of said 1-of-n decoder is at or enters a certain logic state, during a time window defined by said control signal.

3. A detector circuit according to claim 2, wherein said latch circuit means transmits the output signal of said 1-of-n decoder if the feedback loop is deactivated by said control signal.

4. A detector circuit according to claim 3, wherein said latch circuit means comprises:
    a first gate, having a first input connected with said output of said 1-of-n decoder; and
    a second gate, having a first input for receiving said control signal, and a second input connected with an output of said first gate, said second gate having an output connected with a second input of said first gate.

5. A detector circuit according to claim 4, wherein said first gate is an OR gate, and said second gate is an AND gate.

6. A detector circuit according to claim 1, wherein said latch circuit means has an output connected to a sample and hold circuit.

7. A detector circuit according to claim 6, wherein said sample and hold circuit includes a flip-flop.

8. A detector circuit according to claim 1, wherein said comparator circuit means comprises two comparator circuits and said latch circuit means comprises three latch circuits, and said 1-of-n decoder is a 1-of-3 decoder.

9. A method for detecting state changes of a level of a binary signal in an integrated circuit tester, comprising the steps of:

feeding said level of said binary signal to one input of at least one comparator circuit;

feeding an output signal of said comparator circuit to an input of a 1-of-n decoder; and feeding an output signal of said 1-of-n decoder where n is an integer to a latch circuit comprising a feedback loop which may be activated by a control signal.

10. A method according to claim 9, comprising the additional step of:

feeding an output signal of said latch circuit to an input of a sample and hold circuit.

* * * * *

UNITED STATES PATENT AND TRADEMARK OFFICE
CERTIFICATE OF CORRECTION

PATENT NO. : 5,336,944
DATED : August 9, 1994
INVENTOR(S) : Fischer

It is certified that error appears in the above-indentified patent and that said Letters Patent is hereby corrected as shown below:

Claim 1, col. 10, line 29 delete "coupled" and after "integer" insert --,coupled--.

Claim 9, col. 11, line 4 after "decoder" insert --where, n is an integer--; lines 5-6 delete the phrase "where n is an integer--.

Signed and Sealed this

Fifteenth Day of November, 1994

Attest:

BRUCE LEHMAN

Attesting Officer  Commissioner of Patents and Trademarks